(12) United States Patent  
Wang

(10) Patent No.: US 7,385,285 B2
(45) Date of Patent: Jun. 10, 2008

(54) LIGHT ASSEMBLY

(75) Inventor: Liang-Shu Wang, Taipei (TW)

(73) Assignee: Compal Communications, Inc., Taipei (TW)

( * ) Notice: Subject to any disclaimer, the term of this patent is extended or adjusted under 35 U.S.C. 154(b) by 10 days.

(21) Appl. No.: 11/392,417

(22) Filed: Mar. 29, 2006

(65) Prior Publication Data

US 2007/0228553 A1 Oct. 4, 2007

(51) Int. Cl.
*H01L 23/34* (2006.01)
(52) U.S. Cl. .......................... 257/712; 257/81
(58) Field of Classification Search ............... 257/712, 257/81
See application file for complete search history.

(56) References Cited

U.S. PATENT DOCUMENTS 7,183,632 B2 * 2/2007 Arndt ...................... 257/672
2004/0004435 A1 * 1/2004 Hsu ........................ 313/512

FOREIGN PATENT DOCUMENTS

JP        P2003-243718 A   *   8/2003

* cited by examiner

*Primary Examiner*—Roy Potter
(74) *Attorney, Agent, or Firm*—Ladas & Parry LLP

(57) ABSTRACT

A light assembly includes a fin-type heatsink and a light module. The fin-type heatsink has a contact surface. The light module includes a thermally conductive cup-shaped chip seat and a light-emitting chip. The thermally conductive cup-shaped chip seat is attached to the contact surface of the fin-type heatsink, and defines a mounting recess. The light-emitting chip is mounted in the mounting recess in the thermally conductive cup-shaped chip seat. A method for making the light assembly is also disclosed.

7 Claims, 4 Drawing Sheets

US 7,385,285 B2

LIGHT ASSEMBLY

BACKGROUND OF THE INVENTION

1. Field of the Invention

The invention relates to a light assembly, more particularly to a light assembly including a heatsink, and a light module that is attached to the heatsink.

2. Description of the Related Art

A conventional light assembly includes a printed circuit board (PCB) and a light module. The PCB includes a dielectric substrate, and a copper foil formed on the dielectric substrate. The PCB is etched such that a first portion of the copper foil serves as first and second circuit traces and such that a second portion of the copper foil serves as a mounting base for mounting the light module thereon. Each of the first and second circuit traces has a first end that is coupled to a voltage supply, and a second end that is opposite to the first end of a respective one of the first and second circuit traces. The light module is mounted on the mounting base, and includes first and second external connection terminals, each of which is connected to the second end of a respective one of the first and second circuit traces. The mounting base dissipates heat generated by the light module.

The aforementioned light assembly is disadvantageous in that the mounting base is inefficient at dissipating heat generated by the light module.

SUMMARY OF THE INVENTION

Therefore, the object of the present invention is to provide a light assembly that can overcome the aforesaid drawback associated with the prior art.

According to one aspect of the present invention, a light assembly comprises a fin-type heatsink and a light module. The fin-type heat sink has a contact surface. The light module includes a thermally conductive cup-shaped chip seat and a light-emitting chip. The thermally conductive cup-shaped chip seat is attached to the contact surface of the fin-type heatsink, and defines a mounting recess. The light-emitting chip is mounted in the mounting recess in the thermally conductive cup-shaped chip seat.

According to another aspect of the present invention, a method for making a light assembly, which includes a fin-type heatsink, a flexible printed circuit and a light module, comprises the steps of: attaching the flexible printed circuit to the fin-type heatsink; attaching the light module to the fin-type heatsink; and connecting electrically the light module to the flexible printed circuit.

BRIEF DESCRIPTION OF THE DRAWINGS

Other features and advantages of the present invention will be come apparent in the following detailed description of the preferred embodiments with reference to the accompanying drawings, of which.

DETAILED DESCRIPTION OF THE PREFERRED EMBODIMENTS

Figure 1:
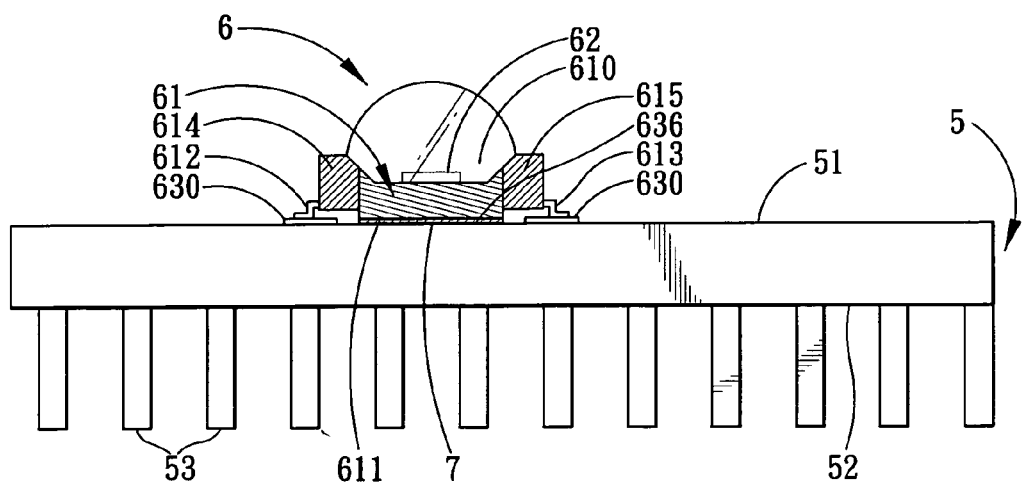
FIG. 1 is a partly sectional schematic view of the first preferred embodiment of a light assembly according to the present invention.

Before the present invention is described in greater detail, it should be noted that like elements are denoted by the same reference numerals throughout the disclosure.

Figure 2:
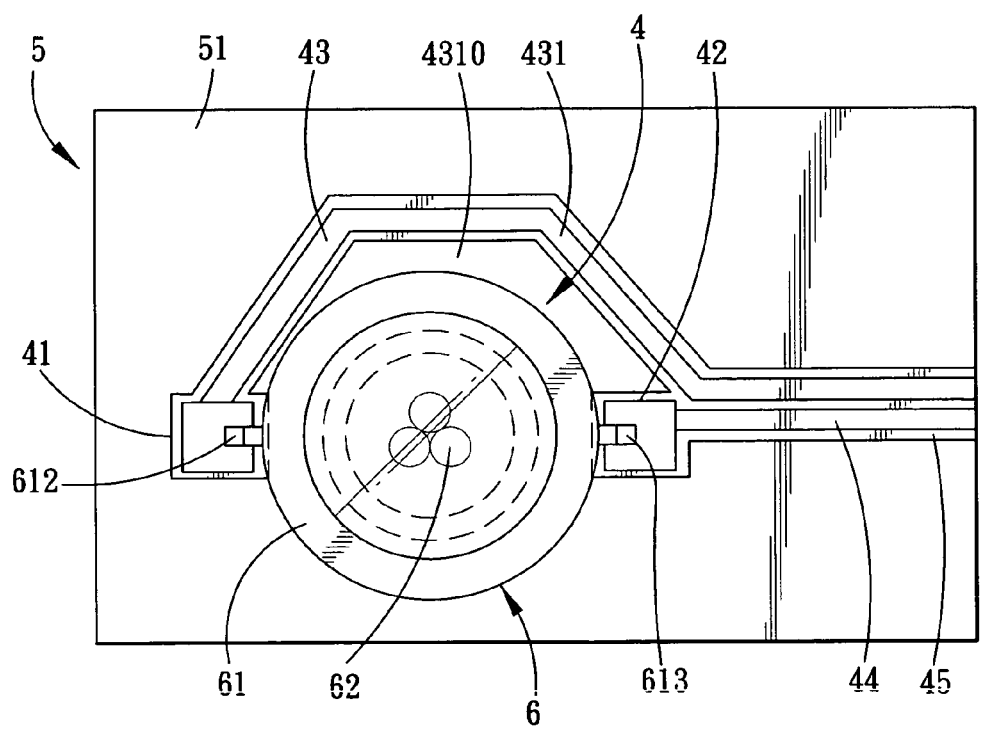
FIG. 2 is a schematic view to illustrate a flexible printed circuit on a heatsink of the first preferred embodiment.

Referring to FIGS. 1 and 2, the first preferred embodiment of a light assembly according to this invention is shown to include a fin-type heatsink 5 and a light module 6.

The fin-type heatsink 5 has a contact surface 51, and a fin surface 52 that is opposite to the contact surface 51 of the fin-type heatsink 5 and that is formed with a plurality of heatsink fins 53.

In an alternative embodiment, the light assembly may include one of a coolant-type heatsink (not shown) and a uniform heat-conducting heatsink (not shown). In yet another embodiment, the light assembly may include a combination of the fin-type heatsink 5, the coolant-type heatsink, and the uniform heat-conducting heatsink.

The light module 6 includes a thermally conductive cup-shaped chip seat 61, a light-emitting chip 62, and a terminal unit.

The thermally conductive cup-shaped chip seat 61 of the light module 6 has lateral sides 614, 615, and a bottom side 611 that interconnects the lateral sides 614, 615 of the thermally conductive cup-shaped chip seat 61 and that cooperates with the thermally conductive cup-shaped chip seat 61 to define a mounting recess 610. The bottom side 611 of the thermally conductive cup-shaped chip seat 61 is attached to the contact surface 51 of the fin-type heat sink 5.

It is noted that, in this embodiment, the light assembly further includes a thermally conductive adhesive 7. The bottom side 611 of the thermally conductive cup-shaped chip seat 61 is bonded to the contact surface 51 of the fin-type heat sink 5 through the thermally conductive adhesive 7 that is applied to the contact surface 51 of the fin-type heatsink 5.

The light-emitting chip 62 of the light module 6 includes a plurality of light-emitting diodes, and is mounted in the mounting recess 610 in the thermally conductive cup-shaped chip seat 61.

In this embodiment, the thermally conductive cup-shaped chip seat 61 is made from metal for conducting heat generated by the light-emitting chip 62 and for transferring heat conducted thereby to the fin-type heatsink 5.

The terminal unit of the light module 6 includes first and second external connection terminals 612, 613 that are coupled respectively to positive and negative terminals (not shown) of the light-emitting chip 62, and that extend outwardly of the thermally conductive cup-shaped chip seat 61.

The light assembly of this embodiment further includes a flexible printed circuit (FPC) 4 that is disposed on the contact surface 51 of the fin-type heat sink 5. The FPC 4 includes first and second conductive pads 41, 42, first and second circuit traces 43, 44, and an insulative layer 45. Each of the first and second conductive pads 41, 42 of the FPC 4 is connected, such as by soldering, to a respective one of the first and second external connection terminals 612, 613 of the terminal unit. Each of the first and second circuit traces 43, 44 of the FPC 4 has a first end portion that is connected to a respective one of the first and second conductive pads 41, 42 of the FPC 4, and a second end portion that is opposite to the first end portion of a respective one of the first and second circuit traces 43, 44 of the FPC 4 and that is connected to a power source (not shown). The insulative layer 45 of the FPC 4 covers the first and second circuit traces 43, 44 of the FPC 4.

In an alternative embodiment, the second end portion of the first and second circuit traces 43, 44 of the FPC 4 are further connected to electric components (not shown).

It is noted that the first circuit trace 43 of the FPC 4 has a curve segment 431 that defines a recess 4310. The light module 6 is received in the recess 4310.

Figure 3:
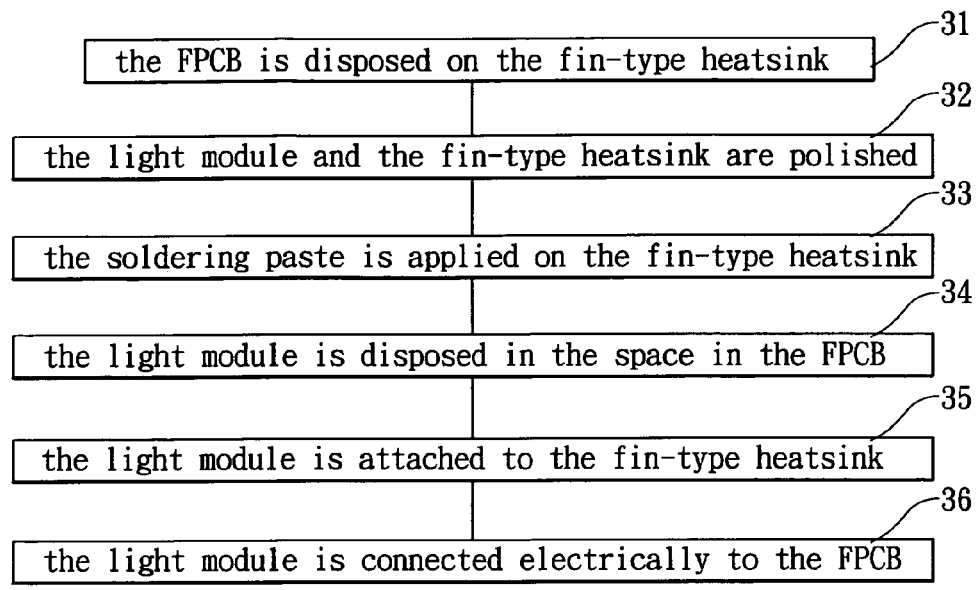
FIG. 3 is a flowchart of the preferred embodiment of a method for making a light assembly according to the present invention.

The preferred embodiment of a method for making the light assembly according to this invention includes the steps shown in FIG. 3.

In step 31, the FPC 4 is attached to the contact surface 51 of the fin-type heatsink 5.

In step 32, the bottom side 611 of the thermally conductive cup-shaped chip seat 61 of the light module 6 and the contact surface 51 of the fin-type heatsink 5 are polished.

In step 33, the thermally conductive adhesive 7 is applied to the contact surface 51 of the fin-type heatsink 5.

In step 34, the light module 6 is disposed in the recess 4310 in the curve segment 431 of the first circuit trace 43 of the FPC 4.

In step 35, the bottom side 611 of the thermally conductive cup-shaped chip seat 61 of the light module 6 is bonded to the contact surface 51 of the fin-type heatsink 5 with the use of the thermally conductive adhesive 7.

In step 36, the first and second external connection terminals 612, 613 of the terminal unit of the light module 6 are connected electrically and respectively to the first and second conductive pads 41, 42 of the FPC 4.

Figure 4:
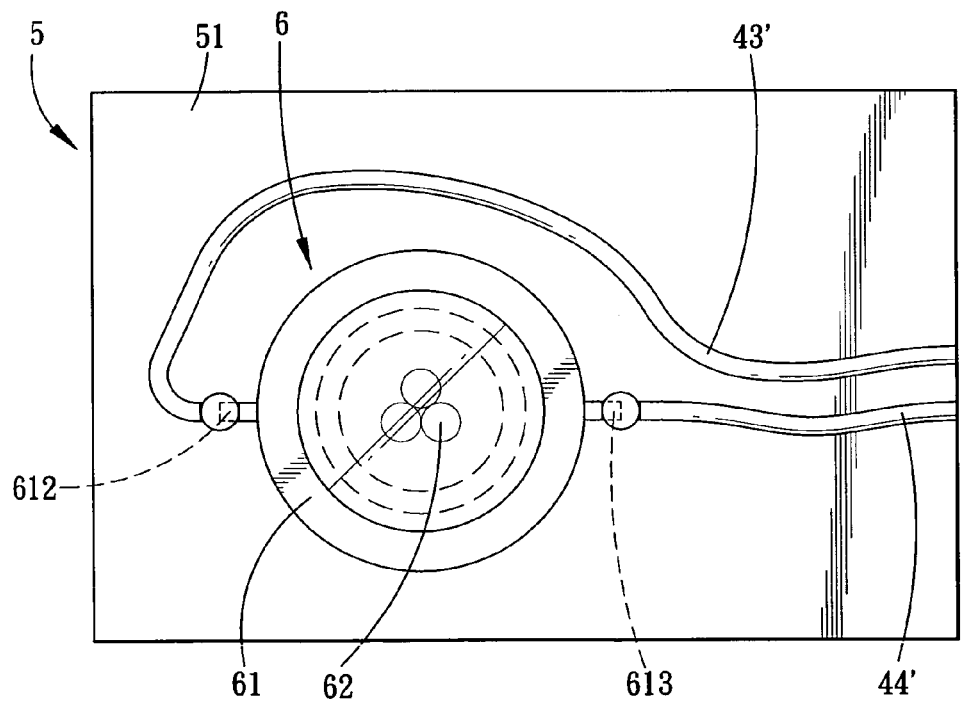
FIG. 4 is a schematic view of the second preferred embodiment of a light assembly according to the present invention.

FIG. 4 illustrates the second preferred embodiment of a light assembly according to this invention. When compared with the previous embodiment, the light assembly is dispensed with the FPC 4. In this embodiment, the light assembly further includes a pair of first and second connecting wires 43', 44', each of which has first and second end portions. Each of the first end portions of the first and second connecting wires 43', 44' is connected to a respective one of the first and second external connection terminals 612, 613 of the terminal unit.

Figure 5:
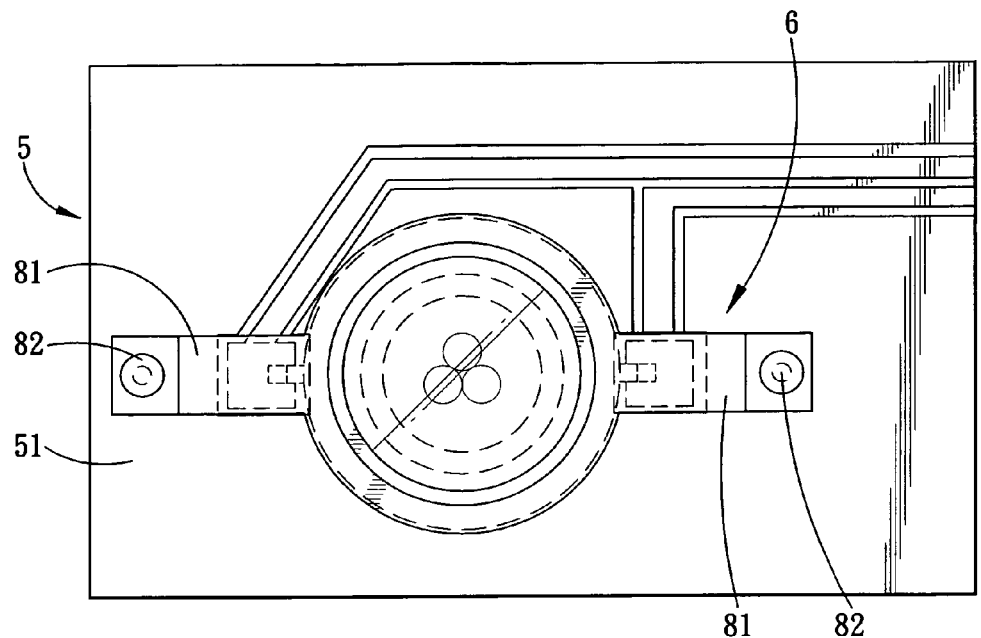
FIG. 5 is a schematic view of the third preferred embodiment of a light assembly according to the present invention.
Figure 6:
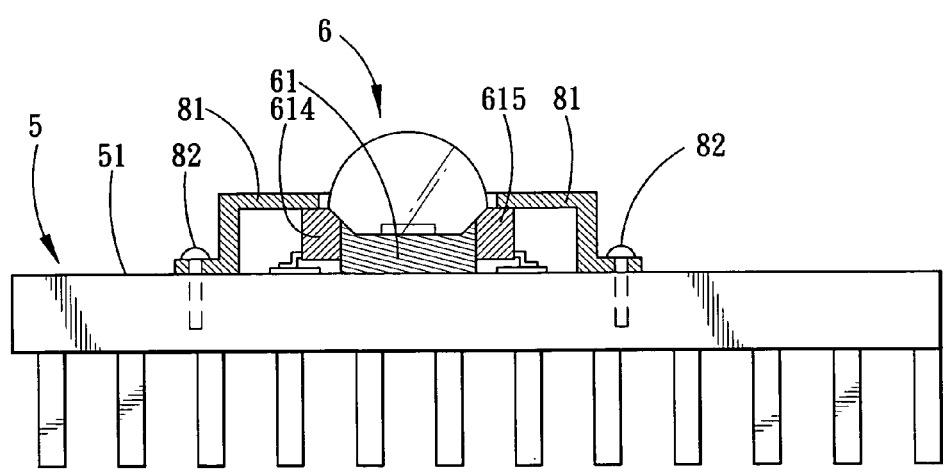
FIG. 6 is a partly schematic sectional view of the third preferred embodiment.

FIGS. 5 and 6 illustrate the third preferred embodiment of a light assembly according to this invention. When compared with the first embodiment, the light assembly is dispensed with the thermally conductive adhesive 7 (see FIG. 1). In this embodiment, the light assembly further includes a pair of flanges 81 and a pair of screw fasteners 82. Each of the flanges 81 extends outwardly from a respective one of the lateral sides 614, 615 of the thermally conductive cup-shaped chip seat 61. Each of the screw fasteners 82 extends through a respective one of the flanges 81 and threadedly engages the fin-type heatsink 5, as best shown in FIG. 6.

Figure 7:
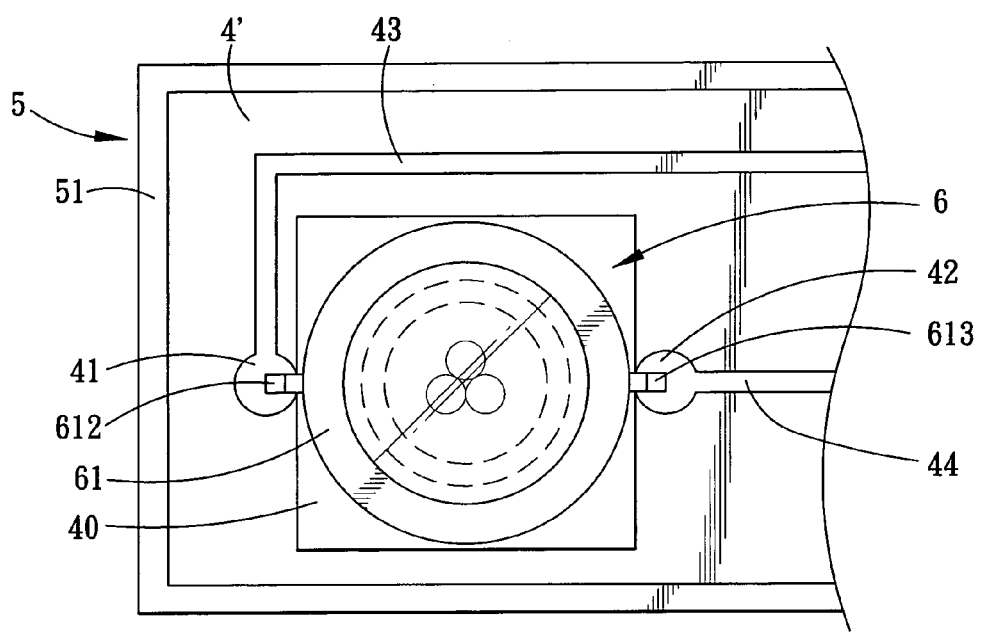
FIG. 7 is a schematic view of the fourth preferred embodiment of a light assembly according to the present invention.

FIG. 7 illustrates the fourth preferred embodiment of a light assembly according to this invention. When compared with the previous embodiment, the light assembly is dispensed with the FPC 4. In this embodiment, the light assembly further includes a printed circuit board (PCB) 4'. The first and second conductive pads 41, 42, and the first and second circuit traces 43, 44 are formed, such as by etching, on the PCB 4'. The PCB 4' defines with a hole 40 therethrough. The thermally conductive cup-shaped chip seat 61 of the light module 6 extends through the hole 40 in the PCB 4'. Accordingly, the first and second external connection terminals 612, 613 of the terminal unit can be connected to the first and second conductive pads 41, 42 of the PCB 4'.

It has thus been shown that the light assembly of this invention includes a fin-type heatsink 5 and a light module 6. The fin-type heat sink 5 has a contact surface 51. The light module 6 includes a thermally conductive cup-based chip seat 61 that is attached to the contact surface 51 of the fin-type heatsink 5, and a light-emitting chip 62 that is disposed in the thermally conductive cup-based chip seat 61. The construction as such permits efficient dissipation of heat generated by the light-emitting chip 62.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light assembly, comprising:
   a fin-type heatsink having a contact surface; and
   a light module including
      a thermally conductive cup-shaped chip seat attached to said contact surface of said fin-type heatsink, and defining a mounting recess, and
      a light-emitting chip mounted in said mounting recess in said thermally conductive cup-shaped chip seat;
   wherein said light module further includes a terminal unit, said terminal unit including first and second external connection terminals that are coupled to said light-emitting chip and that extend outwardly of said thermally conductive cup-shaped chip seat.

2. The light assembly as claimed in claim 1, further comprising a flexible printed circuit attached to said contact surface of said fin-type heatsink, said flexible printed circuit including first and second circuit traces, each of which is coupled to a respective one of said first and second external connection terminals of said terminal unit.

3. The light assembly as claimed in claim 2, wherein said first circuit trace of said flexible printed circuit has a curve segment that defines a recess for receiving said light module therein.

4. The light assembly as claimed in claim 1, further comprising a thermally conductive adhesive applied to said contact surface of said fin-type heatsink for bonding said thermally conductive cup-shaped chip seat to said contact surface of said fin-type heatsink.

5. The light assembly as claimed in claim 1, further comprising first and second connecting wires, each of which is coupled to a respective one of said first and second external connection terminals of said terminal unit.

6. The light assembly as claimed in claim 1, further comprising a pair of flanges, each of which extends outwardly from said thermally conductive cup-shaped chip seat, and a pair of screw fasteners, each of which extends through a respective one of said flanges and threadedly engages said fin-type heatsink.

7. The light assembly as claimed in claim 1, further comprising:
   a printed circuit board defining a hole for extension of said thermally conductive cup-shaped chip seat therethrough; and
   first and second circuit traces formed on said printed circuit board, and coupled respectively to said first and second external connection terminals of said terminal unit.

* * * * *